United States Patent
Christopher

[15] 3,688,154
[45] Aug. 29, 1972

[54] ASTABLE MULTIVIBRATOR CIRCUIT WITH MEANS FOR ENSURING PROPER STARTING OF OSCILLATIONS

[72] Inventor: Todd J. Christopher, Indianapolis, Ind.

[73] Assignee: RCA Corporation

[22] Filed: May 11, 1970

[21] Appl. No.: 36,058

[52] U.S. Cl. ...............315/27 TD, 307/113, 307/144
[51] Int. Cl. .........................H03k 3/282, H01j 29/70
[58] Field of Search ...........331/113, 144; 315/27 TD

[56] References Cited

UNITED STATES PATENTS

| | | | |
|---|---|---|---|
| 3,259,852 | 7/1966 | Todd | 331/113 |
| 3,380,002 | 4/1968 | Hogue | 331/144 |
| 3,334,315 | 8/1967 | Stratton | 331/113 |
| 3,333,213 | 7/1967 | Sheetz | 331/144 |

*Primary Examiner*—Benjamin A. Borchelt
*Assistant Examiner*—R. Kinberg
*Attorney*—Eugene M. Whitacre

[57] ABSTRACT

In an astable multivibrator circuit, a diode operates in conjunction with a voltage supply derived from the multivibrator output signal to insure the initiation of oscillations by limiting base drive current to the multivibrator transistors when power is first applied. This prevents saturation of both transistors and ensures sufficient loop gain to initiate oscillations in response to an unbalance in the system. As power is first applied, the diode is non-conductive and a relatively low voltage is applied to bias the multivibrator transistors. During normal operation, the voltage derived from the multivibrator output signal causes the diode to conduct, thereby coupling the base circuits to the operating potential supply. While conductive, the diode forward voltage drop compensates for changes in the $V_{be}$ of the transistors due to temperature variations and tends to maintain a constant charging current for the base circuits.

14 Claims, 1 Drawing Figure

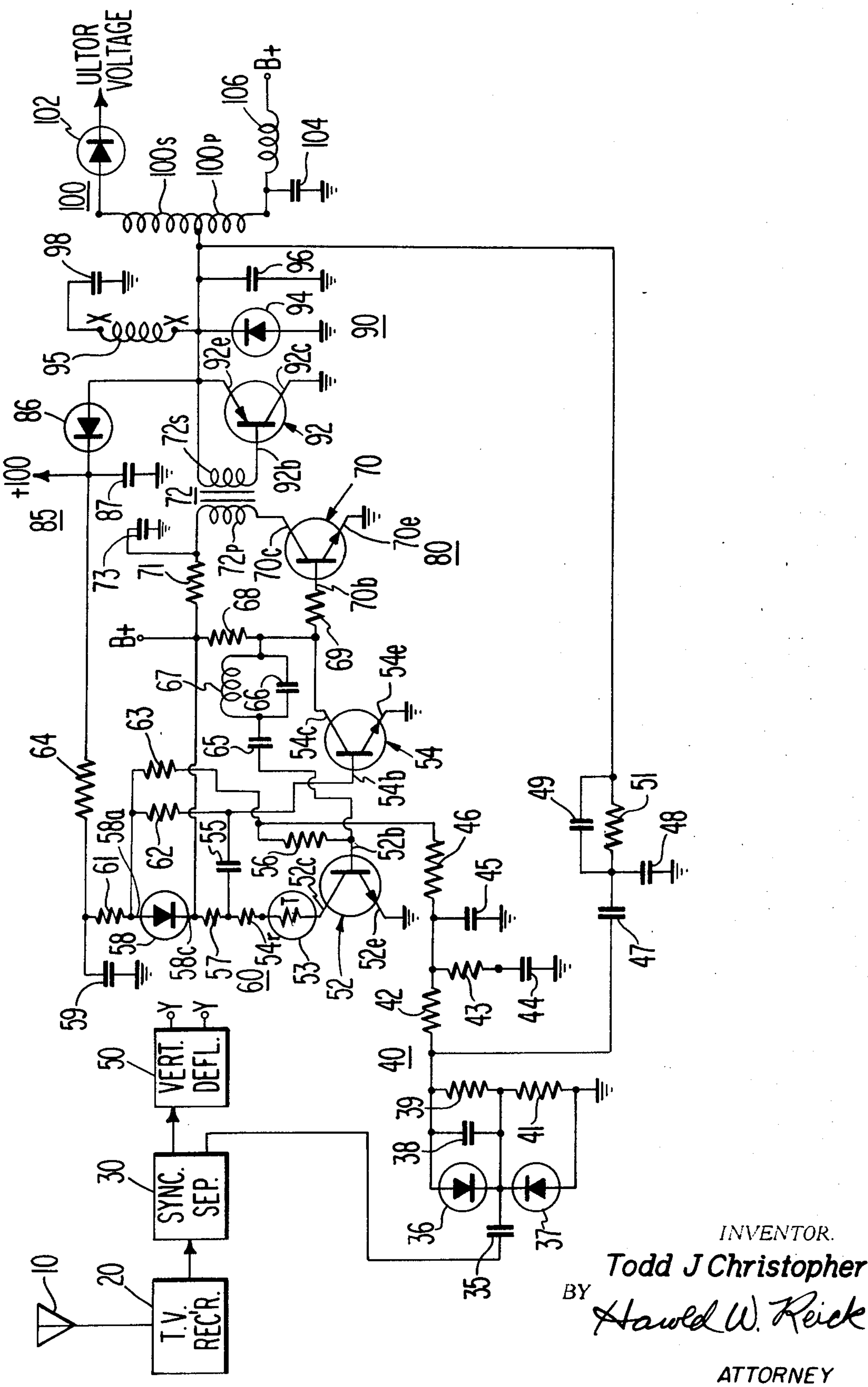
INVENTOR.
Todd J Christopher
BY Harold W. Reick
ATTORNEY

ASTABLE MULTIVIBRATOR CIRCUIT WITH MEANS FOR ENSURING PROPER STARTING OF OSCILLATIONS

The present invention relates to multivibrator circuits and more particularly to an astable multivibrator which can be employed as an oscillator in a television receiver.

When an astable multivibrator circuit is employed as an oscillator, and utilizes transistors having relatively high $h_{FE}$ characteristics, it is possible for both transistors to saturate simultaneously as power is first applied. If this occurs, there may be insufficient loop gain to initiate oscillations.

Transistor multivibrator circuits embodying the present invention are responsive to a control voltage derived from the multivibrator output signal to operate a switch which controls the bias voltage applied to the multivibrator transistors. When the multivibrator is not oscillating, the switch causes the base bias current to be low enough to prevent the transistors from saturating. In the unsaturated region of conduction, the loop gain in the multivibrator circuit is sufficiently high so that unbalances within the system will cause one of the transistors to take control, thereby initiating oscillations. After the multivibrator begins oscillating, the switch is operated by the voltage derived from the multivibrator output signal and the base bias current is increased. In accordance with a feature of the invention, the switch may comprise a diode which provides temperature compensation for the multivibrator transistors.

The features and advantages of the present invention can best be understood with reference to the sole FIGURE and the following description thereof.

The FIGURE illustrates partially in block and schematic diagram form a television receiver including the circuitry of the present invention.

In the figure, an antenna 10 receives television signals and couples them to a television receiver 20 which includes, for example, a tuner, I.F. stages, a video detector, an audio stage and a video output stage which couples video signals to a control element on a kinescope (not shown in the figure). The circuits contained within stage 20 are similar to the circuitry of the television receiver described by RCA Television Service Data 1969 No. T-14, published by RCA Sales Corporation, Indianapolis, Indiana. The receiver couples composite video and synchronizing signals to a synchronization separator stage 30 which separates the video signal from the synchronizing signal components as well as separating the vertical and horizontal synchronizing signal components. The vertical sync signals are then coupled to a vertical deflection stage 50 which includes a vertical oscillator and deflection output stage to develop the required vertical deflection current which is coupled to a vertical deflection winding (not shown in the figure) associated with the kinescope by means of terminals Y—Y.

The horizontal synchronizing signals are applied to a conventional single-ended automatic frequency control (A.F.C.) stage 40 from the sync separator 30 by means of a coupling capacitor 35. Stage 40 includes A.F.C. diodes 36 and 37, a capacitor 38, a resistor 39 and a resistor 41 coupled as shown in the figure. Reference signals representative of the horizontal oscillator frequency are applied to the A.F.C. stage by means of an integrating circuit comprising capacitors 47, 48 and 49, and a resistor 51. This network receives flyback pulses from a horizontal output stage 90 and integrates them to provide a generally sawtooth waveform which is then applied to the A.F.C. circuit 40. The circuit also includes a filter network comprising a resistor 42, a resistor 43, a capacitor 44, a capacitor 45 and a resistor 46. The filter serves to remove the high frequency components and provides a control signal which is applied to the oscillator stage 60.

Oscillator stage 60 is of the multivibrator type and utilizes two transistors 52 and 54 each having base, collector and emitter terminals. The collector circuit of transistor 52 includes a thermistor 53, a resistor **54*r* and a resistor 57, the series combination being coupled from a power supply (B+ which is +12 V) to a collector terminal 52*c* on transistor 52. A coupling capacitor 55 is coupled from the junction of resistors 54*r* and 57 to a base terminal 54*b* of transistor 54. Transistor 54 has a collector terminal 54*c* coupled to the B+ supply by means of a resistor 68. A parallel tuned circuit comprising inductor 67 and capacitor 66 is coupled from terminal 54*c* to a coupling capacitor 65 which has its remote terminal coupled to a base terminal 52*b* on transistor 52. A base resistor 62 is coupled from the base terminal 54*b* of transistor 54 to an anode terminal 58*a* of a diode 58. A second base resistor 63 is coupled from the base terminal 52 *b* of transistor 52 by means of resistor 56 to the anode 58*a* of diode 58. A junction point for the two base bias resistors 62 and 63 is thus formed at the anode terminal 58*a*. Anode terminal 58*a* of diode 58 is coupled to a voltage supply 85 by means of an impedance network including resistor 61, a capacitor 59, and a resistor 64. A cathode terminal 58*c* of diode 58** is coupled to the B+ supply.

Output signals from the multivibrator stage 60 which are present at the collector terminal **54*c* of transistor 54 are applied to a transistor driver stage 80 by means of a resistor 69 coupled from the collector terminal 54*c* of transistor 54 to a base terminal 70*b* of a driver transistor 70. A collector terminal 70*c* of transistor 70 is coupled to the B+ supply by means of a primary winding 72*p* of a transformer 72 and a resistor 71. A secondary winding 72*s* of transformer 72 couples signals from the driver stage 80 to a horizontal output stage 90. A capacitor 73 coupled to the junction of resistor 71 and winding 72*p* provides a pulse of current which flows through winding 72*p* when transistor 70 is conductive. The horizontal output stage 90 includes a horizontal output transistor 92 having base, collector and emitter terminals, a damper diode 94, a retrace capacitor 96 and a horizontal deflection winding 95 including an S-shaping capacitor 98. The driver and output stage operate in a conventional manner to provide the required horizontal deflection drive to the horizontal deflection winding 95. Operating power for the horizontal output stage is provided by means of the B+ supply having an input filter network comprising an inductor 106 and a capacitor 104 and which is coupled to the output stage by means of a primary winding 100*p* of transformer 100. In addition to providing the deflection drive current for the yoke, the output stage develops the ultor voltage for the kinescope by means of a secondary winding 100*s* on transformer 100 which applies relatively high voltage pulses to a rectifier 102**. The rectified high voltage is then applied to a high voltage terminal on the kinescope (not shown).

During normal operation of the horizontal output stage, flyback pulses are present at the emitter terminal 92*e* of transistor 92 during the retrace portion of each horizontal deflection cycle. These pulses are rectified by a diode 86 to provide an auxiliary voltage supply 85. The rectified pulses are filtered by a capacitor 87 which is coupled from the cathode of diode 86 to ground. Voltage across capacitor 87 in addition to providing a control signal for the switching diode 58, supplies approximately +100 volts which is employed in the video stages of the television receiver 20. If the base bias resistors 62 and 63 shown in the figure are returned directly to the B+ supply as is commonly done, and the $h_{FE}$ of transistors 52 and 54 is sufficiently high, it is possible for both transistors to be saturated simultaneously in which case, there is not enough loop gain to initiate oscillations.

In the present circuit, a diode 58 is connected between the junction point of resistors 62 and 63 and the B+ supply. This diode serves as a switching means in the following manner. As power is first applied to the circuit, the base bias supply for the multivibrator transistors 52 and 54 is from the B+ supply associated with the horizontal transformer 100. The current path includes inductor 106, transformer primary 100*p*, diode 86, resistor 64, resistor 61, and base resistors 62 and 63 associated with transistors 52 and 54 respectively. As the B+ is first applied, the anode voltage at diode 58 will be at a value less than the B+ potential due to the voltage drop through resistors 61 and 64, thus diode 58 will be non-conductive. The values of these resistors are chosen such that the base drive current at this instant is sufficiently positive to bias transistors 52 and 54 into their conduction region, but their value is also chosen such that while biasing transistors 52 and 54 into their conduction region, they will not permit sufficient base drive to allow transistors 52 and 54 to saturate. Thus, the loop gain of the system will be sufficiently high that the differences in transistor characteristics will cause oscillations to be initiated.

During operation, it is necessary to provide sufficient base drive current to saturate the multivibrator transistors to thereby provide a well defined voltage at their collector terminals during their conduction and thus insure frequency stability. In the present circuit, once oscillations begin, a horizontal frequency signal is applied to the driver transistor 70 which is coupled to the horizontal output stage 90 by means of transformer 72 and flyback pulses will appear at the emitter terminal 92*e* of the horizontal output transistor 92. These flyback pulses are rectified by diode 86 and filtered by capacitor 87 to develop a relatively high (+100 volts) which is coupled by means of resistors 61 and 64 to the anode of diode 58. Hence, once oscillations have begun, diode 58 will be forward biased and the common junction of resistors 62 and 63 is clamped to the B+ voltage (approximately +12 volts) plus the forward voltage drop of the diode 58. When diode 58 is conductive, it serves to isolate the oscillator from voltage fluctuations in the supply 85 by clamping the voltage applied to resistors 62 and 63 as described above. It is also seen that while diode 58 is conducting, its forward voltage drop will vary with temperature changes in a manner to compensate for variations in the forward voltage drop of transistors 52 and 54 with temperature changes. A thermistor 53 provides additional temperature compensation and a parallel tuned circuit comprising capacitor 66 and inductor 67 provides waveshaping of the signal which is applied to the base of transistor 52.

Circuit parameters utilized in the circuit of the sole figure are as follows:

| | | |
|---|---|---|
| Capacitors | 55 | .0022 microfarads |
| | 59 | 2.2 microfarads |
| | 65 | 560 picofarads |
| | 66 | .0022 microfarads |
| | 87 | 10 microfarads |
| | 96 | .039 microfarads |
| | 98 | 6.5 microfarads |
| | 104 | 100 microfarads |
| Inductors | 67 | 30 millihenries |
| | 106 | 500 microhenries |
| Resistors | 54r | 6.8 kilohms |
| | 56 | 27 kilohms |
| | 57 | 6.8 kilohms |
| | 61 | 15 kilohms |
| | 62 | 27 kilohms |
| | 63 | 150 kilohms |
| Resistors | 64 | 33 kilohms |
| | 68 | 470 ohms |
| | 69 | 220 ohms |
| | 71 | 120 ohms |
| Thermistor | 53 | 1,000 ohms at 25°C |
| Transistors | 52 | 2N3643 |
| | 54 | 2N3643 |
| | 70 | 2N3643 |
| | 92 | RCA 40440 |
| Diodes | 58 | Fairchild FCH 600 |
| | 86 | Fairchild FD 222 |
| | 94 | RCA 40442 |
| | 102 | ITT type TV14 |

What is claimed is:

1. In a multivibrator circuit including a pair of transistors, each having base, emitter and collector electrodes,
   - a first biasing circuit path having resistance connected between the base electrodes of said transistors and an operating potential supply terminal,
   - switch means connected between the base electrodes of said transistors and said operating potential supply terminal,
   - means for deriving a control voltage in response to an output signal from said multivibrator, and
   - means for applying said control voltage to said switch means to actuate said switch means to the closed position to provide a second biasing path between the base electrodes of said transistors and said operating potential supply terminal, said second biasing path having a lower resistance than said first path.

2. A circuit as defined in claim 1 wherein said first biasing circuit provides a biasing current of low enough value to keep said transistors out of saturation.

3. A circuit as defined in claim 2 wherein said switch means comprises a semiconductor diode connected to be forward biased by said control voltage.

4. In a multivibrator circuit including at least two transistors and base bias resistors associated with said transistors, a circuit comprising:
   - means providing a first biasing path including said base biasing resistors,
   - a power supply for providing an operating potential to said multivibrator, circuit means coupled to said multivibrator and responsive to signals from said multivibrator to develop a first input signal in the presence of oscillation signals from said multivibrator and a second output signal in the absence of said oscillation signals, and switching means coupled from said power supply to said base bias resistors and to said circuit means, said switching means responsive to said first output signal from said circuit means to couple said base bias resistors to said power supply for providing a second biasing path for said base biasing resistors.

5. A circuit as defined in claim 4 wherein said circuit means comprises a voltage supply which supplies a first voltage in the absence of oscillations and a second voltage greater than said first voltage in the presence of oscillations from said multivibrator circuit.

6. In a multivibrator circuit including at least two transistors and base bias resistors associated with said transistors, a circuit comprising:

a power supply for providing an operating potential to said multivibrator:

a voltage supply comprising a rectifier circuit coupled to a horizontal output stage of a television receiver at a point to receive flyback pulses during a retrace interval of each horizontal deflection cycle for supplying a relatively low voltage in the absence of oscillations and a relatively high voltage in the presence of oscillations from said multivibrator circuit; and unidirectional conducting means coupled from said power supply to said base bias resistors and to said voltage supply, said unidirectional conducting means responsive to said relatively high voltage from said voltage supply to couple said base bias resistors to said power supply.

7. In a multivibrator circuit including at least two transistors and base bias resistors associated with said transistors, a circuit comprising:

a first power supply for providing an operating potential to said multivibrator;

a second power supply;

means including a first unidirectional conducting device coupled to said multivibrator and to said second power supply and responsive to signals from said multivibrator to develop a first output signal in the presence of oscillation signals from said multivibrator and a second output signal in the absence of said oscillation signals; and switching means comprising a diode rectifier having a cathode terminal coupled to said first power supply and an anode terminal coupled to said base bias resistors associated with said multivibrator transistors and further coupled to said means including a first unidirectional conducting device and being responsive to said first output signal.

8. An oscillator circuit comprising:

first and second electron devices coupled together in an astable multivibrator configuration, each said device having a control element and said second device having an output terminal, a power supply for providing an operating potential to said multivibrator, biasing means coupled through a first biasing path to said control elements, means coupled to said output terminal for providing a first voltage level in response to astable operation of said multivibrator and for providing a second voltage level in response to the absence of said astable operation, and switching means coupled from said power supply to said biasing means and to said means for providing first and second voltage levels, said switching means responsive to said first voltage level to couple said power supply to said biasing means through a second biasing path.

9. An astable multivibrator circuit including first and second transistors each having base, collector and emitter terminals, and further including:

a power supply for providing operating current to said multivibrator, biasing resistors coupled to each of said base terminals and having their remote terminals coupled to a common junction point, a voltage supply coupled to said common junction point, said supply being responsive to signals from said multivibrator for providing a bias voltage to said biasing resistors in the absence of astable operation of said multivibrator circuit and for providing a higher voltage level in response to astable operation, and switching means coupled from said power supply to said junction point and responsive to said higher voltage level to couple said power supply to said biasing resistors.

10. A circuit as defined in claim 9 wherein said bias voltage maintains said transistors in their non-saturated conduction region.

11. In a television receiver, a horizontal output stage in which flyback pulses are developed during a retrace portion of each deflection cycle, a horizontal oscillator coupled to said output stage, said oscillator having two transistors arranged in an astable multivibrator configuration including base biasing means, a voltage supply coupled to said horizontal output stage for developing a first output voltage in the absence of said flyback pulses, and responsive to the presence of said flyback pulses for developing a higher output voltage, impedance means coupling said voltage supply to said base biasing means, a power supply for providing operating current to said horizontal oscillator, and switching means responsive to said presence of flyback pulses for coupling said power supply to said base biasing means.

12. A circuit as defined in claim 11 wherein said first voltage developed by said voltage supply biases said transistors in their non-saturated conduction region, and wherein said power supply output is sufficient to bias said transistors in their saturation region of conduction during astable operation.

13. A circuit as defined in claim 11 wherein said impedance means includes at least a resistance element.

14. A circuit as defined in claim 11 wherein said switching means comprises a diode.

* * * * *

UNITED STATES PATENT OFFICE
CERTIFICATE OF CORRECTION

Patent No. 3,688,154 Dated August 29, 1972

Inventor(s) Todd J. Christopher

It is certified that error appears in the above-identified patent and that said Letters Patent are hereby corrected as shown below:

Column 5, line 3, that portion reading "input" should read -- output --.

Signed and sealed this 13th day of February 1973.

(SEAL)
Attest:

EDWARD M.FLETCHER,JR.
Attesting Officer

ROBERT GOTTSCHALK
Commissioner of Patents